(12) United States Patent
Lee et al.

(10) Patent No.: US 9,275,743 B1
(45) Date of Patent: Mar. 1, 2016

(54) SEMICONDUCTOR MEMORY DEVICE AND OPERATING METHOD THEREOF

(71) Applicant: SK hynix Inc., Icheon-si Gyeonggi-do (KR)

(72) Inventors: Hee Youl Lee, Icheon-si (KR); Kyung Sik Mun, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/601,841

(22) Filed: Jan. 21, 2015

(30) Foreign Application Priority Data

Aug. 20, 2014 (KR) .......................... 10-2014-0108420

(51) Int. Cl.
*G11C 16/04* (2006.01)
*G11C 16/10* (2006.01)
*G11C 11/56* (2006.01)

(52) U.S. Cl.
CPC ............ *G11C 16/10* (2013.01); *G11C 11/5628* (2013.01); *G11C 11/5642* (2013.01); *G11C 16/0483* (2013.01); *G11C 11/5621* (2013.01)

(58) Field of Classification Search
CPC ........... G11C 11/5628; G11C 11/5642; G11C 11/5621; G11C 16/10; G11C 16/0483
USPC .............. 365/185.24, 185.18, 185.17, 185.05
See application file for complete search history.

(56) References Cited

U.S. PATENT DOCUMENTS

| | | | | |
|---|---|---|---|---|
| 6,987,694 B2 * | 1/2006 | Lee | ..................... | G11C 11/5628 365/185.17 |
| 7,606,080 B2 * | 10/2009 | Lee | ....................... | G11C 16/344 365/185.17 |
| 8,520,440 B2 * | 8/2013 | Ahn | .................... | G11C 16/0483 365/185.17 |
| 8,737,140 B2 * | 5/2014 | Kim | ....................... | G11C 16/24 365/185.24 |
| 8,923,061 B2 * | 12/2014 | Kim | .................... | G11C 16/0483 365/185.17 |

FOREIGN PATENT DOCUMENTS

| | | |
|---|---|---|
| KR | 1020120088360 A | 8/2012 |
| KR | 1020130044711 A | 5/2013 |
| KR | 1020130141869 A | 12/2013 |

* cited by examiner

*Primary Examiner* — Pho M Luu
(74) *Attorney, Agent, or Firm* — William Park & Associates Ltd.

(57) ABSTRACT

An operating method of a semiconductor device is provided. The operating method of the semiconductor memory device includes programming a second source select transistor electrically coupled to a common source line through a first source select transistor; reprogramming the second source select transistor when a threshold voltage of the second source select transistor is less than a target voltage, and ending a program for the second source select transistor when the threshold voltage of the second source select transistor is greater than or equal to the target voltage. The programming includes electrically decoupling the second source select transistor from the common source line by turning off the first source select transistor.

20 Claims, 12 Drawing Sheets

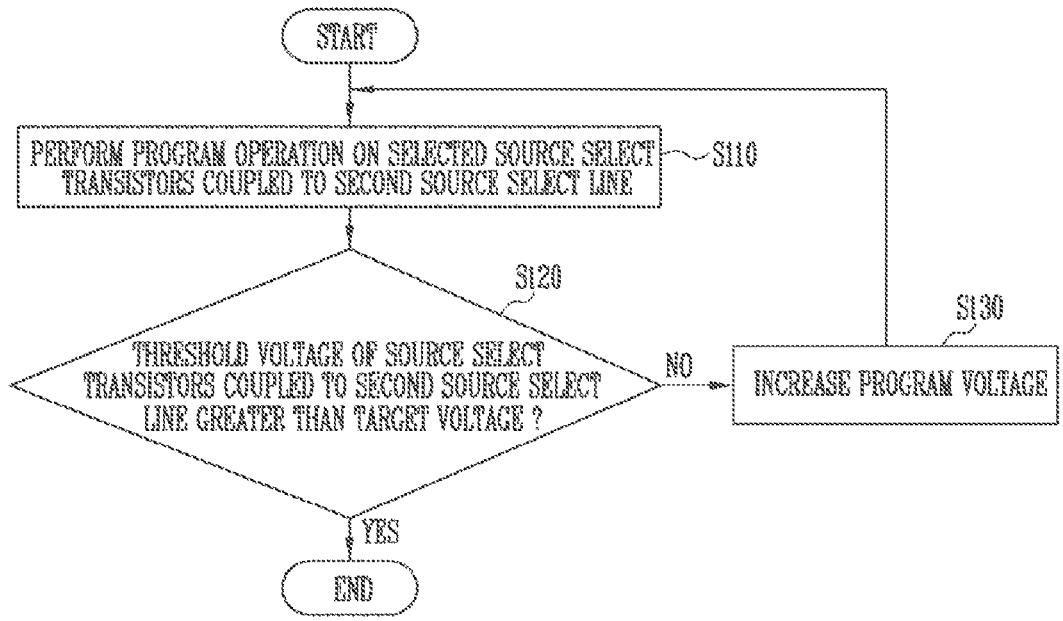

FIG. 7
FIG. 8
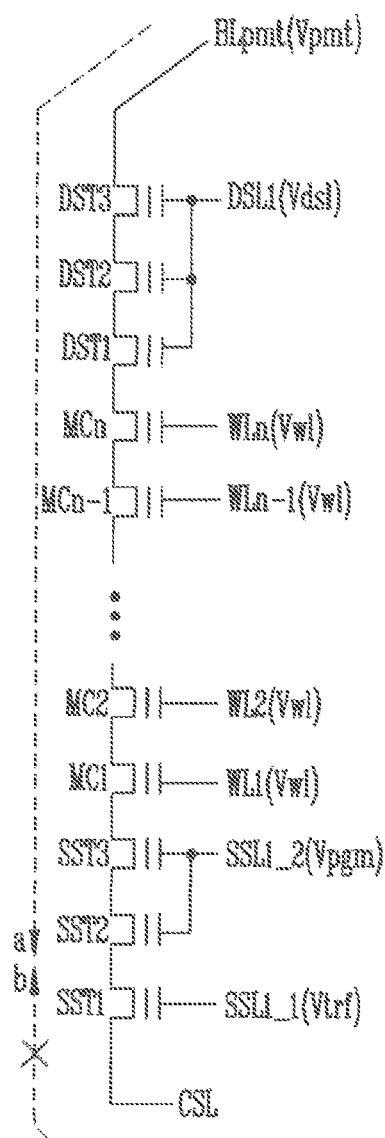
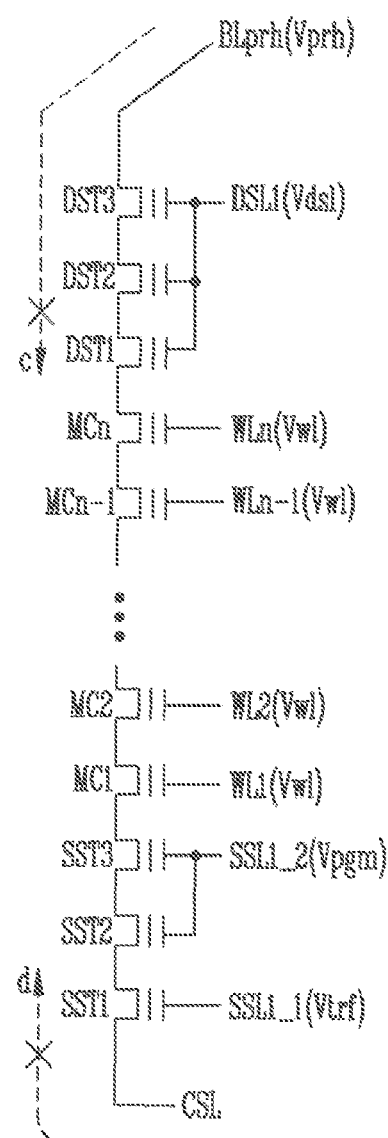

FIG. 12

| Line | voltage |
|---|---|
| BL1~BLm | float |
| DSL1 | float |
| WL1 ~ WLn | float |
| SSL1_2 | float |
| SSL1_1 | Vpgm |
| CSL | Vss |
| DSL2 | float |
| SSL2_2 | float |
| SSL2_1 | Vpgm |

FIG. 13

| Line | voltage |
|---|---|
| BL1~BLm | Vss |
| DSL1 | Vpass2 |
| WL1 ~ WLn | Vpass2 |
| SSL1_2 | Vpass1 |
| SSL1_1 | Vpgm |
| CSL | Vss |
| DSL2 | Vpass2 |
| SSL2_2 | Vpass1 |
| SSL2_1 | Vpgm |

FIG. 15

| Line | voltage |
|---|---|
| BLpmt | Vpmt |
| BLprh | Vprh |
| DSL1 (selected) | Vdsl |
| WL1 ~ WLn | Vwl |
| SSL2 | Vpgm |
| SSL1 | Vtrf |
| CSL | Vcsl |
| DSL2 (unselected) | Vss |

SEMICONDUCTOR MEMORY DEVICE AND OPERATING METHOD THEREOF

CROSS-REFERENCE TO RELATED APPLICATION

The present application claims priority to Korean patent application number 10-2014-0108420 filed on Aug. 20, 2014, in the Korean Intellectual Property Office, the entire disclosure of which is incorporated by reference herein.

BACKGROUND

1. Technical Field

The invention relates to an electronic device, more specifically, relates to a semiconductor memory device and an operating method thereof.

2. Related Art

A semiconductor memory device is a memory device using a semiconductor such as silicon (Si), germanium (Ge), gallium arsenide (GaAs), indium phosphide (InP), or the like. The semiconductor memory device can be classified as a volatile memory device and a nonvolatile memory device.

The volatile memory device is a memory device which loses stored data when a power supply cuts off. The volatile memory device includes a static RAM (SRAM), a dynamic RAM (DRAM), a synchronous DRAM (SDRAM), or the like. The nonvolatile memory device is a memory device which maintains stored data even when a power supply cuts off. The nonvolatile memory device includes a read only memory (ROM), a programmable ROM (PROM), an electrically programmable ROM (EPROM), an electrically erasable and programmable ROM (EEPROM), flash memory, a phase-change RAM (PRAM), a magnetic RAM (MRAM), a resistive RAM (RRAM), a ferroelectric RAM (FRAM), or the like. The flash memory can be classified as a NOR-type and a NAND-type.

Recently, in order to improve a degree of integration of the semiconductor memory device, a semiconductor memory device having three-dimensional array structure has been studied.

SUMMARY

One aspect of the invention provides an operating method of a semiconductor memory device. The operating method includes programming a second source select transistor electrically coupled to a common source line through a first source select transistor. The operating method also includes reprogramming the second source select transistor when a threshold voltage of the second source select transistor is less than a target voltage. The operating method also includes ending a program with respect to the second source select transistor when the threshold voltage of the second source select transistor is greater than or equal to a target voltage. The programming includes applying a program permission voltage to a bit line, turning on at least one drain select transistor and memory cells and transmitting the program permission voltage to the second source select transistor. The programming also includes turning off the first source select transistor and electrically decoupling the second source select transistor from the common source line. Further, the programming includes applying a program voltage to the second source select transistor and increasing the threshold voltage of the second source select transistor.

An aspect of the invention provides an operating method of a semiconductor memory device. The operating method includes applying a program permission voltage or a program inhibition voltage to bit lines of cell strings. The operating method also includes applying a drain select line voltage greater than the program permission voltage and less than or equal to the program inhibition voltage to a drain select line electrically coupled to drain select transistors of the cell strings and turning on or turning off the drain select transistors. The operating method also includes applying a word line voltage to memory cells of the cell strings, turning off first source select transistors of the cell strings, and applying a program voltage to gates of second source select transistors of the cell strings.

An aspect of the invention provides a semiconductor memory device. The semiconductor memory device includes a cell string including a plurality of source select transistors electrically coupled to a common source line in series, at least one drain select transistor electrically coupled to a bit line, and memory cells electrically coupled between the at least one drain select transistor and the source select transistors; and a peripheral circuit configured to control the cell string. The peripheral circuit is configured to program a second source select transistor electrically coupled to the common source line through a first source select transistor. Further, the peripheral circuit is configured to reprogram the second source select transistor when the threshold voltage of the second source select transistor is less than a target voltage, and end a program with respect to the second source select transistor when the threshold voltage of the second source select transistor is greater than or equal to the target voltage. In this instance, the peripheral circuit applies a program permission voltage to the bit line during the programming, turns on the at least one drain select transistor and the memory cells and transmits the program permission voltage to the second source select transistor. In this case, the peripheral circuit also turns off the first source select transistor and electrically decouples the second source select transistor from the common source line, and applies a program voltage to a gate of the second source select transistor and increases the threshold voltage of the second source select transistor.

BRIEF DESCRIPTION OF THE DRAWINGS

FIG. 5 is a flow chart for describing a program operation with respect to each of second source select lines;

FIG. 6 is a table illustrating voltages applied in S110 of FIG. 5;

FIG. 7 is a view illustrating that second and third source select transistors of a program permission cell string among selected cell strings are programmed;

FIG. 8 is a view illustrating that second and third source select transistors of a program inhibition cell string among the selected cell strings are program-inhibited;

FIG. 12 is a table illustrating voltages applied in S210 of FIG. 10 according to an embodiment of the invention;

FIG. 13 is a table illustrating voltages applied in S210 of FIG. 10 according to an embodiment of the invention;

FIG. 15 is a table illustrating voltages applied in S110 when applying the case of FIG. 6 to a memory block of FIG. 14;

DETAILED DESCRIPTION

Figure 1:
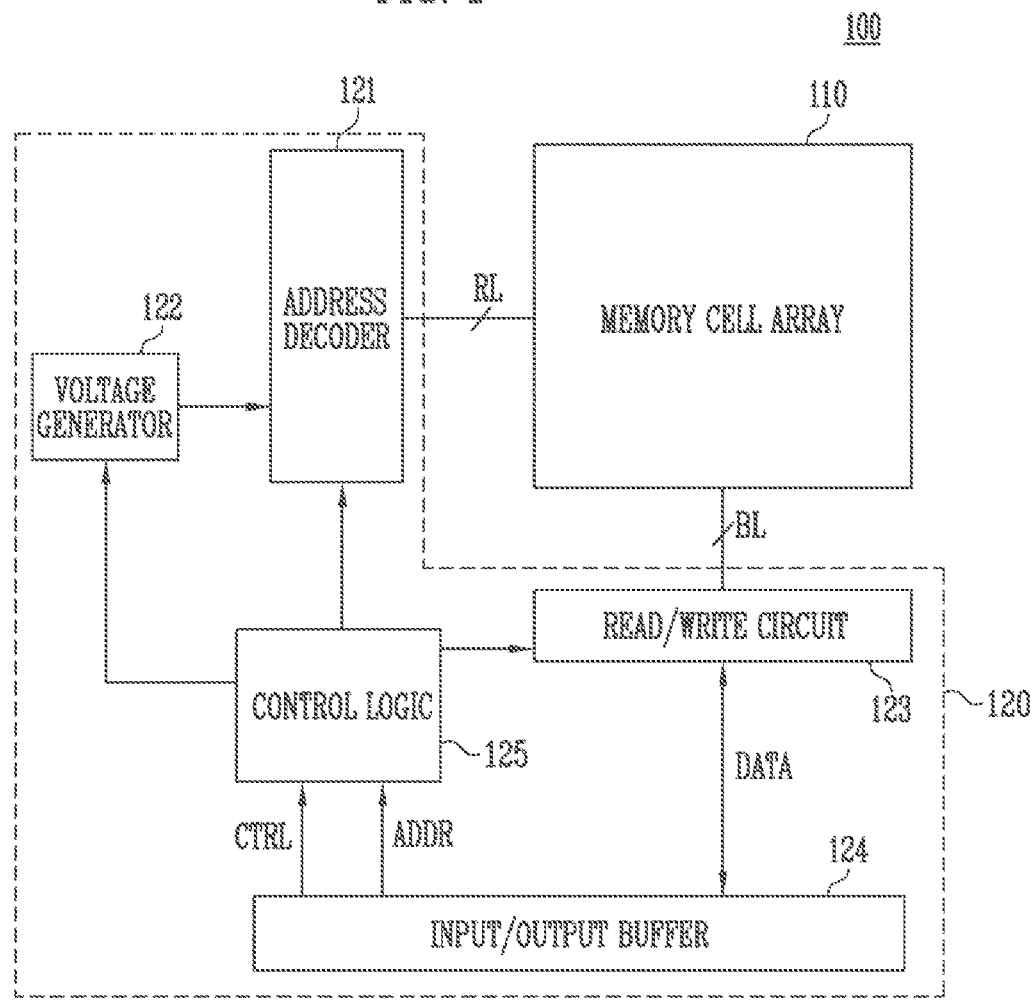
FIG. 1 is a block diagram illustrating a semiconductor memory device.

Advantages and features of the invention and methods of achieving the same will be described more fully hereinafter with reference to the accompanying figures and embodiments of the invention. This invention may, however, be embodied in different forms and should not be construed as limited to the embodiments set forth. The embodiments of the invention are provided for describing in detail to be easily implemented by those of ordinary skill in the art, and the spirit and scope of the invention should be understood by claims of the invention. The invention provides a semiconductor memory device and an operating method thereof having improved reliability.

When referring to as "one element (elements), and other devices are electrically coupled", a device can be directly electrically coupled to or electrically coupled via other devices. Throughout the entire detailed description, the same reference numerals refer to the same components. The "and/or" includes each and all combinations of one or more of the items mentioned.

Referring to FIG. 1, a block diagram illustrating a semiconductor memory device 100 is described.

The semiconductor memory device 100 includes a memory cell array 110 and peripheral circuits 120.

The memory cell array 110 is electrically coupled to an address decoder 121 through row lines RL. The memory cell array 110 is electrically coupled to a read/write circuit 123 through bit lines BL.

The memory cell array 110 includes a plurality of memory blocks. The plurality of memory blocks each includes a plurality of cell strings. The plurality of cell strings each includes a plurality of memory cells stacked on a substrate. Moreover, in an embodiment, the plurality of the memory cells are nonvolatile memory cells. In an embodiment, the plurality of the memory cells may be defined as a single-level cell or multi-level cell. The memory cell array 110 will be described below with reference to FIGS. 2 to 4 in more detail.

The peripheral circuits 120 include the address decoder 121, a voltage generator 122, the read/write circuit 123, an input/output buffer 124, and a control logic 125. The peripheral circuits may be configured to control cell strings CS11 to CS1$m$ and CS21 to CS2$m$.

The address decoder 121 is electrically coupled to the memory cell array 110 through the row lines RL. Further, the row lines RL include drain select lines, word lines, source select lines, and a common source line. In an embodiment, the row lines RL may further include a pipeline.

The address decoder 121 is configured to control the row lines RL in response to a control signal of the control logic 125. The address decoder 121 is configured to receive an address ADDR from the control logic 125.

During a program operation and a read operation, the address ADDR includes a block address and a row address. The address decoder 121 is configured to decode the block address within a received address ADDR. The address decoder 121 selects one memory block according to a decoded block address. The address decoder 121 is also configured to decode the row address within the received address ADDR. The address decoder 121 selects one from drain select lines of a selected memory block. The address decoder 121 also selects one from a plurality of word lines of the selected memory block according to a decoded row address. Accordingly, the memory cells corresponding to one page are selected.

In an embodiment, the address ADDR includes a block address during an erase operation. The address decoder 121 decodes the block address. The address decoder 121 also selects one memory block according to a decoded block address. Data stored in the selected memory block is erased.

According to an embodiment of the invention, the semiconductor memory device 100 programs source select transistors electrically coupled to the source select lines. As a result, threshold voltages of the source select transistors may be adjusted to desired levels. While programming the source select transistors, the address decoder 121 in response to the control signal of the control logic 125 may provide a program voltage to a selected source select line.

In an embodiment, the address decoder 121 may include a block decoder, a row decoder, an address buffer, etc.

The voltage generator 122 operates in response to a control signal of the control logic 125. The voltage generator 122 generates an internal power source voltage using an external power source voltage supplied to the semiconductor memory device 100. For instance, the voltage generator 122 generates the internal power source voltage by regulating the external power source voltage. The generated internal power source voltage is provided to the address decoder 121, the read/write circuit 123, the input/output buffer 124, and the control logic 125. In addition, the generated internal power source voltage is therefore, used as an operation voltage of the semiconductor memory device 100.

The voltage generator 122 generates a plurality of voltages using at least one of the external power source voltage and the internal power source voltage. In an embodiment, the voltage generator 122 includes a plurality of pumping capacitors which receive the internal power source voltage. The voltage generator 122 also generates a plurality of voltages by selectively activating the plurality of pumping capacitors in response to the control signal of the control logic 125. For example, the voltage generator 122 may generate various voltages which may be applied to the row lines RL. The voltage generator 122 may also provide the generated voltages to the address decoder 121.

The read/write circuit 123 is electrically coupled to the memory cell array 110 through the bit lines BL. The read/write circuit 123 operates in response to the control signal of the control logic 125.

During an erase operation, the read/write circuit 123 may set the bit lines BL in a floating state. In a program operation, the read/write circuit 123 transmits programming data DATA from the input/output buffer 124 to the bit lines BL. Selected memory cells are programmed according to transmitted data DATA. During a read operation, the read/write circuit 123 reads data DATA through the bit lines BL from the selected memory cells through the bit lines BL. The read/write circuit 123 also outputs read data DATA to the input/output buffer 124.

According to an embodiment of the invention, the semiconductor memory device 100 programs the source select transistors electrically coupled to the source select lines. During the programming of the source select transistors, the read/write circuit 123 may apply a program permission voltage or a program inhibition voltage to the bit lines BL of the cell strings. When a bit line receives the program permission voltage, a threshold voltage of a corresponding source select transistor may be increased. When the bit line receives the program inhibition voltage, a threshold voltage of the corresponding source select transistor may be maintained accordingly.

In an embodiment, the read/write circuit 123 may include page buffers (i.e., page registers), a column select circuit, etc.

The control logic 125 is electrically coupled to the address decoder 121, the voltage generator 122, the read/write circuit 123, and the input/output buffer 124. The control logic 125 receives a control signal CTRL and the address ADDR from the input/output buffer 124. The control logic 125 is configured to control overall operations of the semiconductor memory device 100 according to the control signal CTRL. The control logic 125 transmits the address ADDR to the address decoder 121.

The input/output buffer 124 receives a control signal CTRL and an address ADDR from the outside. The input/output buffer 124 also transmits the control signal CTRL and the address ADDR to the control logic 125. Further, the input/output buffer 124 is configured to transmit an external input data DATA to the read/write circuit 123. In the alternative, the input/output buffer 124 is configured to output data DATA received from the read/write circuit 123 to the outside.

In an embodiment, the semiconductor memory device 100 may be a flash memory device.

Figure 2:
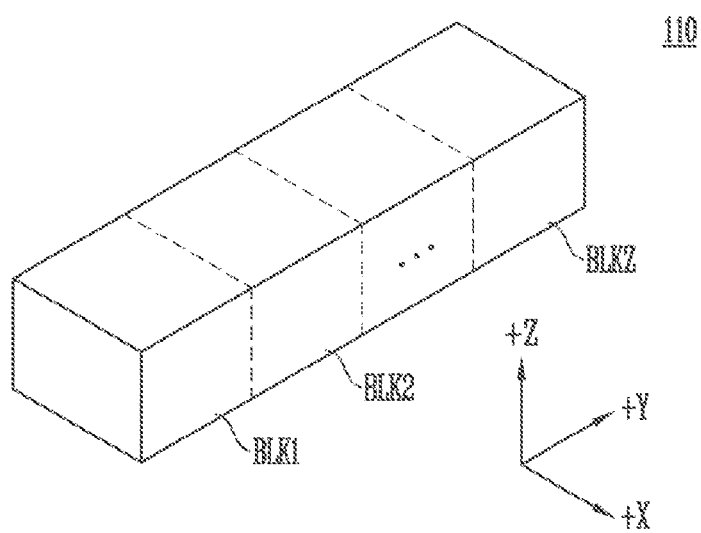
FIG. 2 is a block diagram illustrating a memory cell array of FIG. 1 according to an embodiment of the invention.

Referring to FIG. 2, a block diagram illustrating the memory cell array 110 of FIG. 1 according to an embodiment of the invention is described.

In FIG. 2, the memory cell array 110 includes a plurality of memory blocks BLK1 to BLKz. Each memory block has a three-dimensional structure. Each memory block includes a plurality of memory cells stacked on a substrate. The above-described plurality of memory cells are arranged along a +X direction, a +Y direction and a +Z direction. Further, a structure of each memory block will be described with reference to FIGS. 3 and 4 in more detail below.

Figure 3:
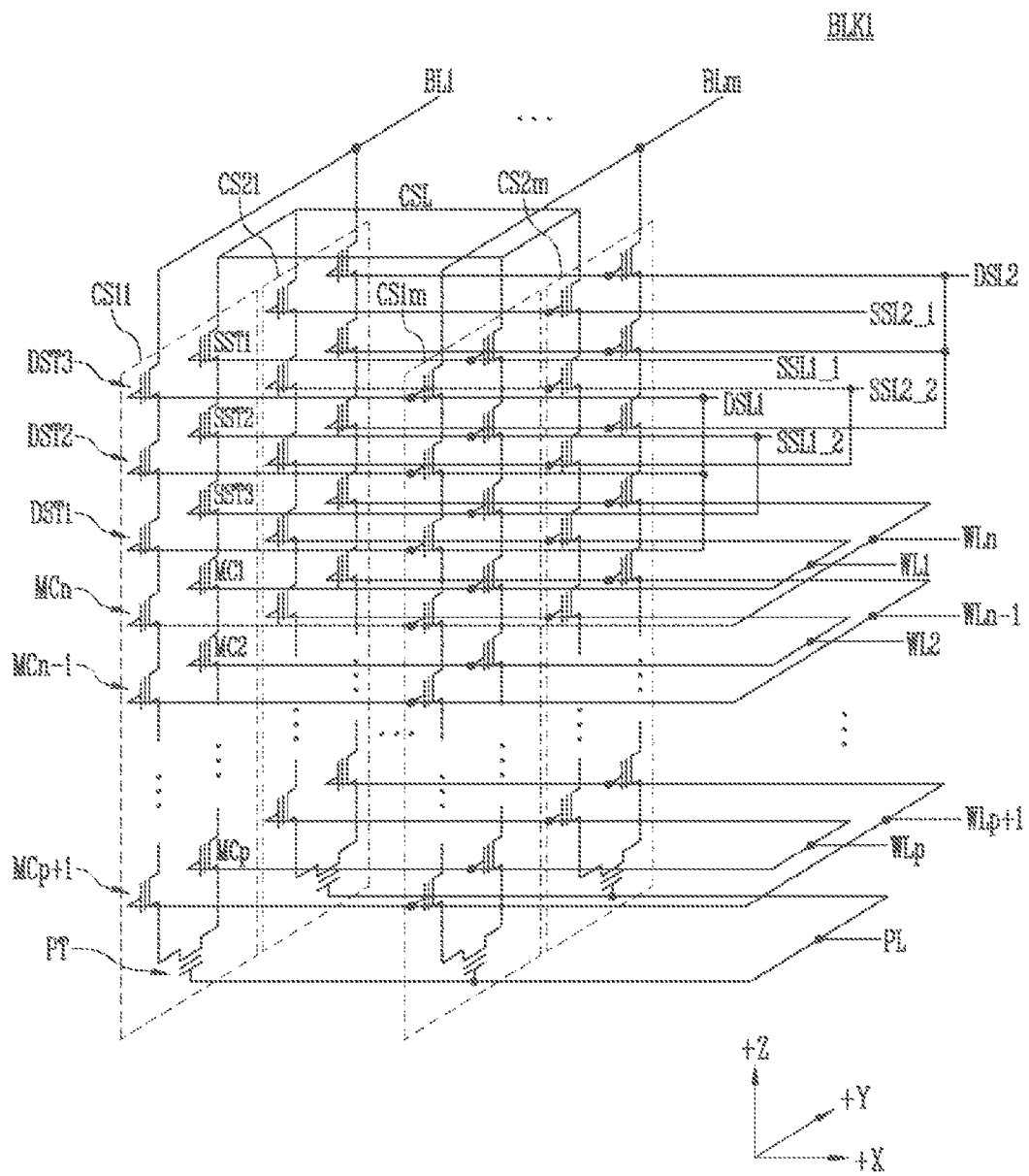
FIG. 3 is a circuit diagram illustrating one among memory blocks of FIG. 2.

Referring to FIG. 3, a circuit diagram illustrating a memory block BLK1 among memory blocks BLK1 to BLKz of FIG. 2 is described.

Moreover, in FIG. 3, a first memory block BLK1 includes a plurality of cell strings CS11 to CS1$m$ and CS21 to CS2$m$. The plurality of cell strings CS11 to CS1$m$ and CS21 to CS2$m$ each may be configured in a 'U' shape. In the first memory block BLK1, m cell strings are arranged in a row direction (i.e., +X direction). In FIG. 3, only two cell strings arranged in a column direction are illustrated. However, the two cell strings are illustrated for the sake of convenience and two or more of cell strings may be arranged in the column direction (i.e., +Y direction) accordingly.

The plurality of cell strings CS11 to CS1$m$ and CS21 to CS2$m$ each include first to third source select transistors SST1 to SST3, first to $n^{th}$ memory cells MC1 to MCn, a pipe transistor PT, and first to third drain select transistors DST1 to DST3.

The select transistors SST1 to SST3 and DST1 to DST3 and the memory cells MC1 to MCn each may have a substantially similar structure. In an embodiment, the select transistors SST1 to SST3 and DST1 to DST3 and the memory cells MC1 to MCn each may include a channel layer, a tunneling insulation layer, a charge storage layer, and a blocking insulation layer. Therefore, the select transistors SST1 to SST3 and DST1 to DST3 and the memory cells MC1 to MCn each have a threshold voltage adjusted by a number of electrons that are trapped in the charge storage layer.

The first to third source select transistors SST1 to SST3 of each cell string are electrically coupled in series between a common source line CSL and memory cells MC1 to MCp. A source of the first source select transistors SST1 of the cell strings CS11 to CS1$m$ and CS21 to CS2$m$ is commonly electrically coupled to the common source line CSL.

In an embodiment, source select transistors of the cell strings (e.g., CS11 to CS1$m$) arranged in the same row direction (+X direction) are electrically coupled to the source select lines (e.g., SSL1_1 and SSL1_2) extending in a row direction. The source select transistors of cell strings CS11 to CS1$m$ in a first row are electrically coupled to source select lines SSL1_1 and SSL1_2. The source select transistors of cell strings CS21 to CS2$m$ in a second row are electrically coupled to source select lines SSL2_1, SSL2_2.

According to an embodiment of the invention, at least one source select transistor SST1 adjacent to the common source line CSL is electrically coupled to a source select line separated from a source select line electrically coupled to the rest of the source select transistors SST2 and SST3 in one cell string. First source select transistors SST1 of the cell strings CS11 to CS1$m$ in the first row are electrically coupled to a first source select line SSL1_1. In addition, second and third source select transistors SST2 and SST3 of the cell strings CS11 to CS1$m$ in the first row are electrically coupled to a second source select line SSL1_2. First source select transistors SST1 of the cell strings CS21 to CS2$m$ in the second row are electrically coupled to a first source select line SSL2_1. Further, second source select transistors SST2 of the cell strings CS21 to CS2$m$ in the second row are electrically coupled to a second source select line SSL2_2.

First to $n^{th}$ memory cells MC1 to MCn of each cell string are electrically coupled between the source select transistors SST1 to SST3 and the drain select transistors DST1 to DST3 and to respective word lines. The drain select transistors DST1 to DST3 may be electrically coupled to a drain select line DSL1 or DSL2. The first to $n^{th}$ memory cells MC1 to MCn may be divided into first to $p^{th}$ memory cells MC1 to MCp and $(p+1)^{th}$ to $n^{th}$ memory cells MCp+1 to MCn. The first to $p^{th}$ memory cells MC1 to MCp and the $(p+1)^{th}$ to $n^{th}$ memory cells MCp+1 to MCn are electrically coupled through the pipe transistor PT.

The first to $p^{th}$ memory cells MC1 to MCp are sequentially arranged in a negative direction of the +Z direction, and electrically coupled in series between the source select transistors SST1 to SST3 and the pipe transistor PT. The $(p+1)^{th}$ to $n^{th}$ memory cells MCp+1 to MCn are sequentially arranged in the +Z direction, and electrically coupled in series between the pipe transistor PT and the drain select transistors DST1 to DST3. Gates of the first to $n^{th}$ memory cells MC1 to MCn are electrically coupled to first to $n^{th}$ word lines WL1 to WLn, respectively.

A gate of a pipe transistor PT of each cell string is electrically coupled to a pipeline PL.

First to third drain select transistors DST1 to DST3 of each cell string are electrically coupled in series between a corresponding bit line and the memory cells MCp+1 to MCn.

Drain select transistors of cell strings (e.g., CS11 to CS1$m$) arranged in the same row direction (+X direction) are electrically coupled to a drain select line (e.g., DSL1) extending in the row direction. A first row and a second row of a memory block BLK1 are defined by first and second drain select lines DSL1 and DSL2. The drain select transistors DST1 to DST3 of the cell strings CS11 to CS1m in the first row are electrically coupled to a first drain select line DSL1. The drain select transistors DST1 to DST3 of the cell strings CS21 to CS2m in the second row are electrically coupled to a second drain select line DSL2.

In an embodiment, the first to third drain select transistors DST1 to DST3 of each cell string may be electrically coupled to one drain select line as illustrated in FIG. 3. Otherwise, in an embodiment different from that illustrated in FIG. 3, the first to third drain select transistors DST1 to DST3 of each cell string may be electrically coupled to different drain select lines.

Cell strings arranged in a column direction (+Y direction) are electrically coupled to a bit line extending in the column direction. Cell strings CS11 and CS21 in a first column are electrically coupled to a first bit line BL1. Cell strings CS1m and CS2m in the $m^{th}$ column are electrically coupled to an $m^{th}$ bit line BLm.

In an embodiment, even bit lines and odd bit lines may be provided instead of first to $m^{th}$ bit lines BL1 to BLm. Even-numbered cell strings among cell strings CS11 to CS1m or CS21 to CS2m may be electrically coupled to the even bit lines, respectively. In addition, odd-numbered cell strings among the cell strings CS11 to CS1m or CS21 to CS2m may be electrically coupled to the odd bit lines, respectively.

In each cell string, the memory cells MC1 to MCp and the source select transistors SST1 to SST3 are sequentially stacked in a direction intersecting a substrate. More specifically, that is, +Z direction as illustrated in FIG. 3. In each cell string, the memory cells MCp+1 to MCn and the drain select transistors SST1 to SST3 are sequentially stacked in the +Z direction.

Since the semiconductor memory device 100 (refer back to FIG. 1) controls the source select transistors SST1 to SST3, the memory cells MC1 to MCn are electrically coupled to the common source line CSL or are electrically turned off. When threshold voltages of the source select transistors SST1 to SST3 are largely different from a desired voltage distribution, the source select transistors SST1 to SST3 may not be effectively controlled as a result.

The source select transistors SST1 to SST3 are assumed to have greater threshold voltages than the desired voltage distribution. When an arbitrary operation is performed while turning on the source select transistors SST1 to SST3, a current flowing into the common source line CSL through the source select transistors SST1 to SST3 may be undesirably reduced as a result. More specifically, an amount of current flowing into the common source line CSL through the cell string may be reduced. The source select transistors SST1 to SST3 are assumed to have threshold voltages smaller than a desired threshold voltage. When an arbitrary operation is performed while turning off the source select transistors SST1 to SST3, current may then be unintentionally leaked into the common source line CSL through the source select transistors SST1 to SST3.

Therefore, effectively setting the threshold voltages of the source select transistors SST1 to SST3 is an important factor to improve the reliability of the semiconductor memory device 100.

Figure 4:
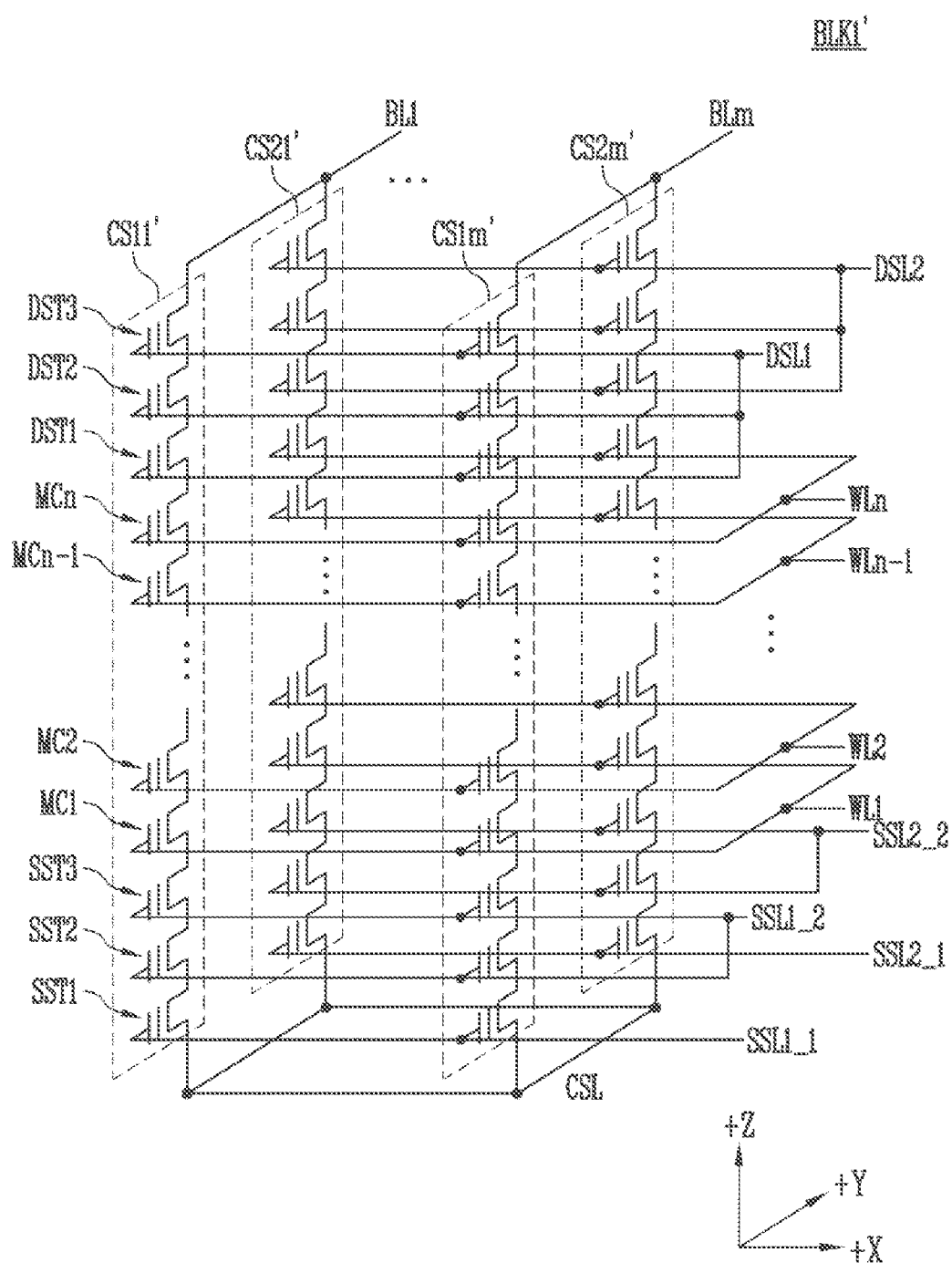
FIG. 4 is a circuit diagram illustrating one among memory blocks of FIG. 2 according to an embodiment of the invention.

Referring to FIG. 4, a circuit diagram illustrating another memory block BLK1' of the memory block BLK1 among memory blocks BLK1 to BLKz of FIG. 2 according to an embodiment of the invention is described.

A first memory block BLK1' includes a plurality of cell strings CS11' to CS1m' and CS21' to CS2m'. The plurality of cell strings CS11' to CS1m' and CS21' to CS2m' each extend along a +Z direction. The plurality of cell strings CS11' to CS1m' and CS21' to CS2m' each include first to third source select transistors SST1 to SST3, first to $n^{th}$ memory cells MC1 to MCn, and first to fourth drain select transistors DST1 to DST4 stacked on a substrate under the first memory block BLK1'

The first to third source select transistors SST1 to SST3 of each cell string are electrically coupled in series between a common source line CSL and source side dummy memory cells SMC1 and SMC2. A source of the first source select transistor SST1 of each cell string is commonly electrically coupled to the common source line CSL.

In each cell string, at least one source select transistor SST1 adjacent to the common source line CSL is electrically coupled to a source select line different from a source select line electrically coupled to the rest of the source select transistors SST2 and SST3. First source select transistors SST1 of the cell strings CS11' to CS1m' in the first row are electrically coupled to a first source select line SSL1_1. In addition, second and third source select transistors SST2 and SST3 of the cell strings CS11' to CS1m' in the first row are electrically coupled to a second source select line SSL1_2. First source select transistors SST1 of the cell strings CS21' to CS2m' in the second row are electrically coupled to a first source select line SSL2_1. Further, second source select transistors SST2 of the cell strings CS21' to CS2m' in the second row are electrically coupled to a second source select line SSL2_2.

First to $n^{th}$ memory cells MC1 to MCn of each cell string are electrically coupled in series between the source select transistors SST1 to SST3 and the drain select transistors DST1 to DST3. Memory cells having the same height may be electrically coupled to the same word line. The first to $n^{th}$ memory cells MC1 to MCn are electrically coupled to the first to $n^{th}$ word lines WL1 to WLn, respectively.

At least one drain select transistor is provided in each cell string. First to third drain select transistors DST1 to DST3 of each cell string are electrically coupled in series between a corresponding bit line and memory cells MC1 to MCn.

The first to third drain select transistors DST1 to DST3 of each cell string are electrically coupled to the same drain select line. Further, drain select transistors of cell strings arranged in the same row are electrically coupled to a drain select line extending in a row direction. Drain select transistors of cell strings CS11' to CS1m' in a first row are electrically coupled to a first drain select line DSL1. Drain select transistors of cell strings CS21' to CS2m' in a second row are electrically coupled to a second drain select line DSL2.

Accordingly, the memory block BLK1' in FIG. 4 has an equivalent circuit similar to the memory block BLK1 in FIG. 3 when excluding the omission of the pipe transistor PT in each cell string.

Hereinafter, an embodiment of the invention will be described mainly with the memory block BLK1 of FIG. 3 for the sake of convenience with respect to the description of the invention.

Referring to FIG. 5, a flow chart to describe a program operation with respect to each of second source select lines SSL1_2 and SSL2_2 is shown.

Source select transistors SST2 and SST3 electrically coupled to the second source select lines SSL1_2 and SSL2_2 may be programmed as a row unit. Initially one memory block (e.g., BLK1) may be selected. Then, after cell strings CS11 to CS1m in a first row are selected, second and third source select transistors SST2 and SST3 electrically coupled to a second source select line SSL1_2 among the cell strings CS11 to CS1m may then be programmed. After cell strings CS21 to CS2m in a second row are selected, second and third source select transistors SST2 and SST3 electrically coupled to the second source select line SSL2_2 among the cell strings CS21 to CS2m may be programmed. Then, the cell strings CS11 to CS1m in the first row are assumed to be selected for convenience of description.

In FIGS. 1, 3, and 5, in S110, a program with respect to the source select transistors SST2 and SST3 electrically coupled to the second source select line SSL1_2 is performed. A threshold voltage of a program permitted source select transistor among the source select transistors SST2 and SST3 electrically coupled to the second source select line SSL1_2 may be increased. A threshold voltage of a program inhibited source select transistor among the source select transistors SST2 and SST3 electrically coupled to the second source select line SSL1_2 may be maintained. The peripheral circuits 120 may be configured to program the source select transistor SST2 through a source select transistor SST1. The peripheral circuits 120 may also be configured to reprogram the source select transistor SST2 when a threshold voltage of the source select transistor SST2 is less than a target voltage. Further the peripheral circuits 120 may be configured to end a program with the source select transistor SST2 when the threshold voltage of the source select transistor SST2 is greater than or equal to a target voltage.

In S120, whether or not threshold voltages of the source select transistors SST2 and SST3 electrically coupled to the second source select line SSL1_2 are greater than a target voltage is determined. For example, the read/write circuit 123 may provide a predetermined voltage or current to the bit lines BL1 to BLm. Further, the address decoder 121 may apply the target voltage to gates of corresponding source select transistors SST2 and SST3 through the second source select line SSL1_2. In addition, the address decoder 121 may control the row lines DSL1, WL1 to WLn, and SSL1_1. The address decoder 121 may also turn on the drain select transistors DST1 to DST3 of each cell string, the memory cells MC1 to MCn, and the first source select transistor SST1.

When a voltage provided to a bit line decreases or a current leaks, it may denote that the threshold voltages of the source select transistors SST2 and SST3 of a corresponding cell string are greater than a target voltage. Moreover, when a voltage provided to the bit line or a current is maintained, it may denote that one among the threshold voltages of the source select transistors SST2 and SST3 of the corresponding cell string is less than the target voltage. The read/write circuit 123 may determine whether or not the source select transistors SST2 and SST3 of the corresponding cell string have the threshold voltages greater than the target voltage after detecting a voltage or a current of the bit line.

When the threshold voltages of the source select transistors SST2 and SST3 electrically coupled to the second source select line SSL1_2 are greater than the target voltage, a program operation is completed. When at least one of the source select transistors SST2 and SST3 electrically coupled to the second source select line SSL1_2 has the threshold voltage smaller than the target voltage, S130 is performed.

In S130, a program voltage to be applied to the second source select line SSL1_2 is increased. The control logic 125 controls the voltage generator 122 to increase the program voltage according to the evaluation result from the read/write circuit 123. S110 is then performed again using an increased program voltage. Among the source select transistors SST2 and SST3 electrically coupled to the second source select line SSL1_2, a program may be performed to increase a threshold voltage of the source select transistor having the threshold voltage smaller than the target voltage.

Referring to FIG. 6, a table illustrating voltages applied in S110 of FIG. 5 is shown. Referring to FIG. 7, a view illustrating that second and third source select transistors SST2 and SST3 of a program permission cell string among selected cell strings CS11 to CS1m are programmed is shown. Referring to FIG. 8, a view illustrating that second and third source select transistors SST2 and SST3 of a program inhibition cell string among the selected cell strings CS11 to CS1m are program-inhibited is shown.

Referring again to FIGS. 3 and 6, a program permission voltage Vpmt is applied to a bit line (BLpmt, hereinafter, a program permission bit line) electrically coupled to the source select transistors SST2 and SST3, which are to be programmed, among the bit lines BL1 to BLm. In an embodiment, the program permission voltage Vpmt may be a reference voltage (e.g., ground voltage Vss). A program inhibition voltage Vprh is applied to a bit line (BLprh, hereinafter, a program inhibition bit line) electrically coupled to the source select transistors SST2 and SST3. The source select transistors SST2 and SST3 are to be inhibited for programming, among the bit lines BL1 to BLm. The program inhibition voltage Vprh may be a positive voltage greater than 0. For example, the program inhibition voltage Vprh may be an internal power source voltage. The program inhibition voltage Vprh is greater than or equal to the drain select line voltage Vdsl. Further, with the peripheral circuits 120, at least one of the drain select transistors DST1 to DST3 and the memory cells MC1 to MCn may be turned on. In addition, with the peripheral circuits 120, the program permission voltage Vpmt may be transmitted to the second source select transistor SST2. Further, through the peripheral circuits 120, the source select transistor SST1 may be turned off, and the source select transistor SST2 may be electrically decoupled from the common source line CSL. In addition, with the peripheral circuits 120, a voltage greater than the program voltage may be applied to a gate of the second source select transistor SST2 and a threshold voltage of the source select transistor SST2 may be increased.

A drain select line voltage Vdsl is applied to a drain select line DSL1 electrically coupled to the selected cell strings CS11 to CS1m and drain select transistors DST1 to DST3. The drain select line voltage Vdsl is greater than the program permission voltage Vpmt. The drain select line voltage Vdsl is less than or equal to the program inhibition voltage Vprh. Drain select transistors DST1 to DST3 of a cell string (hereinafter, a program permission cell string) electrically coupled to the program permission bit line BLpmt among the selected cell strings CS11 to CS1m are turned on by the drain select line voltage Vdsl. While the drain select line voltage Vdsl is provided, the drain select transistors DST1 to DST3 of a cell string (hereinafter, a program inhibition cell string) electrically coupled to the program inhibition bit line BLprh among the selected cell strings CS11 to CS1m are turned off.

A word line voltage Vwl is applied to word lines WL1 to WLn. The word line voltage Vwl may be a positive voltage greater than 0 or a reference voltage or a ground voltage Vss. Memory cells MC1 to MCn are turned on according to the word line voltage Vwl being applied. The memory cells MC1 to MCn may be in an erase state.

A program operation through the second source select lines SSL1_2 and SSL2_2 may be performed before data is stored in memory cells MC1 to MCn. In the above-described embodiment, during the program operation through the second source select lines SSL1_2 and SSL2_2, threshold voltages of the memory cells MC1 to MCn may be less than a reference voltage. Therefore, the memory cells MC1 to MCn may be turned on even when the word line voltage Vwl is the reference voltage.

A pipe line PL, for example, may be controlled similarly as the word lines WL1 to WLn.

Accordingly, the second and third source select transistors SST2 and SST3 of the program permission cell string receive the program permission voltage Vpmt from the program permission bit line BLpmt through the drain select transistors DST1 to DST3 and the memory cells MC1 to MCn (A of FIG. 7). The program inhibition cell string is electrically decoupled from the program inhibition bit line BLprh (C of FIG. 8).

A turn off voltage Vtrf is applied to the source select line SSL1_1 electrically coupled to the selected cell strings CS11 to CS1m. The turn off voltage Vtrf is less than or equal to a voltage Vcsl of the common source line CSL. For instance, the voltage Vcsl of the common source line CSL may be a positive voltage greater than 0. For example, a result of subtracting a threshold voltage of the first source select transistor SST1 from the turn off voltage Vtrf is less than the voltage Vcsl of the common source line CSL. The source select transistors SST1 electrically coupled to the first source select line SSL1_1 are turned off according to the turn off voltage Vtrf being applied. Therefore, the program permission cell string and the program inhibition cell string are electrically decoupled from the common source line CSL (B of FIG. 7 and D of FIG. 8).

As a result, channels of the second and third source select transistors SST2 and SST3 of the program permission cell string receive the program permission voltage Vpmt from the program permission bit line BLpmt. Channels of the second and third select source transistors SST2 and SST3 also do not receive a voltage of the common source line CSL. In contrast, the program inhibition cell string is electrically decoupled from the program inhibition bit line BLprh and the common source line CSL. More specifically, a channel of the program inhibition cell string is floating.

A large amount of the program voltage Vpgm is applied to the second source select line SSL1_2. The threshold voltages of the second and third source select transistors SST2 and SST3 of the program permission cell string are increased by a difference between the program permission voltage Vpmt of the channel and the program voltage Vpgm of the second source select line SSL1_2.

A channel voltage of the program inhibition cell string is changed according to a voltage of an adjacent region. For instance, the channel voltage of the program inhibition cell string is boosted by a coupling effect with the program voltage Vpgm. The threshold voltages of the second and third source select transistors SST2 and SST3 of the program inhibition cell string are not increased since a difference between a boosted voltage of the channel and the program voltage Vpgm of the second source select line SSL1_2 is small.

A reference voltage Vss is applied to a drain select line DSL2 electrically coupled to unselected cell strings CS21 to CS2m. Accordingly, regardless of whether the program permission voltage Vpmt is applied or the program inhibition voltage Vprh is applied to the bit lines BL1 to BLm, drain select transistors DST1 to DST3 electrically coupled to the unselected cell strings CS21 to CS2m are therefore turned off.

The reference voltage Vss is applied to the source select lines SSL2_1 and SSL2_2 electrically coupled to the unselected cell strings CS21 to CS2m. According to a small voltage applied to the second source select line SSL2_2, the threshold voltages of the second and third source select transistors SST2 and SST3 of the unselected cell strings CS21 to CS2m are not increased.

According to an embodiment of the invention, at least one first source select transistor adjacent to common source line is electrically coupled to a first source select line. Further, the rest of the source select transistors are electrically coupled to at least one second source select line. In addition, a program operation through the second source select line may be efficiently performed by separating selected cell strings from the common source line after controlling the first source select line. Therefore, according to an embodiment of the invention, the threshold voltages of the source select transistors are effectively controlled.

Figure 9:
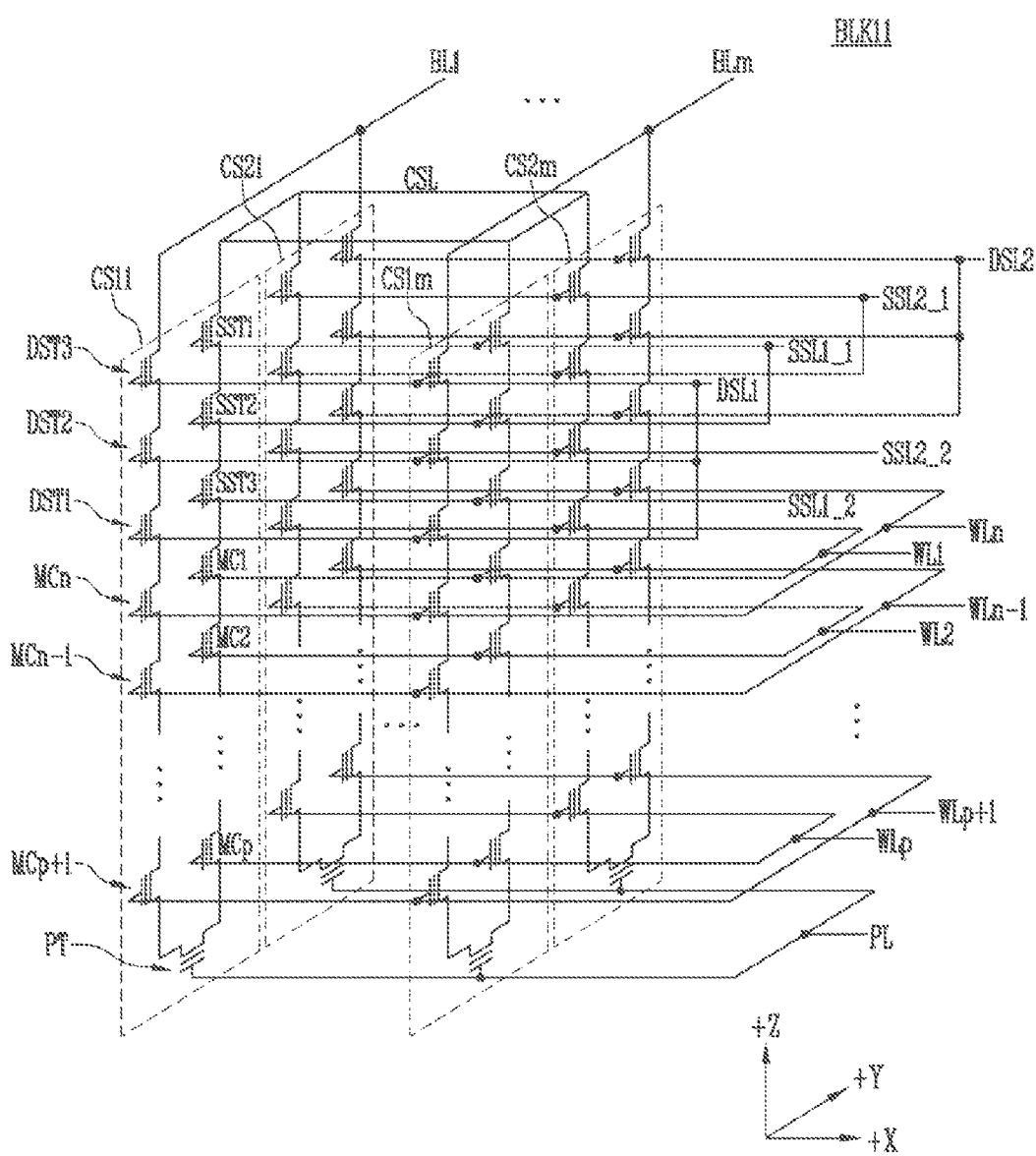
FIG. 9 is a circuit diagram illustrating a modified memory block of FIG. 3 according to an embodiment of the invention.

Referring to FIG. 9, a circuit diagram illustrating a modified memory block BLK11 of the memory block BLK1 of FIG. 3 according to an embodiment of the invention is described.

In FIG. 9, when excluding first to third source select transistors SST1 to SST3 and source select lines SSL1_1, SSL1_2, SSL2_1, and SSL2_2, a memory block BLK11 is operated the same as the memory block BLK1 of FIG. 3. Duplicate descriptions will be omitted accordingly.

According to an embodiment, two or more of source select transistors SST1 and SST2 adjacent to the common source line CSL are electrically coupled to one source select line in each cell string. Further, the remaining source select transistor SST3 is electrically coupled to another source select line.

First and second source select transistors SST1 and SST2 in a first row are electrically coupled to a first source select line SSL1_1. In addition, third source select transistors SST3 in the first row are coupled to a second source select line SSL1_2. First and second source select transistors SST1 and SST2 in a second row are electrically coupled to a first source select line SSL2_1. Moreover, third source select transistors SST3 in the second row are electrically coupled to a second source select line SSL2_2. Further, in an electrical decoupling of the second source select transistor SST2 from a common source line CSL, with the use of the peripheral circuits 120, a voltage of the common source line that is positive is applied to the common source line CSL. In addition, a turn off voltage Vtrf less than or equal to the voltage of the common source line CSL is applied to the first source select line SSL1_1. Moreover, the first source select transistor SST1 is turned off.

The third source select transistors SST3 electrically coupled to the second source select lines SSL1_2 and SSL2_2 may be programmed the same as a program operation through each of the second source select lines SSL1_2 and SSL2_2 described with reference to FIGS. 5 to 8 described above. For example, while programming through the second source select line SSL1_2 in the first row, a turn off voltage Vtrf may be applied to the first source select line SSL1_1. Each threshold voltage of source select transistors SST3 electrically coupled to the second source select line SSL1_2 may be increased or maintained according to a program permission voltage Vpmt (refer to FIG. 6) or a program inhibition voltage Vprh (refer to FIG. 6) applied to corresponding bit line. For example, while programming through a second source select line SSL2_2 in the second row, a turn off voltage Vtrf may be applied to the first source select line SSL2_1. The turn off voltage Vtrf may be a reference voltage, and a threshold voltage of the first source select transistor SST1 is a positive voltage.

Figures 10, 11:
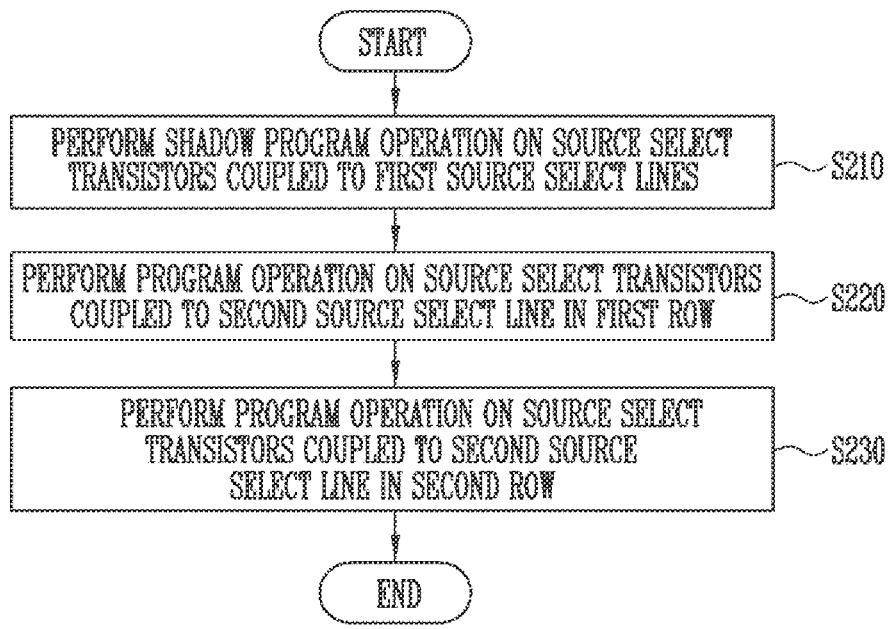
FIG. 10 is a flow chart illustrating a program method with respect to source select transistors of cell strings according to an embodiment of the invention.
FIG. 11 is a table illustrating voltages applied in S210 of FIG. 10 according to an embodiment of the invention.

Referring to FIG. 10, a flow chart illustrating a program method with respect to source select transistors SST1 to SST3 of cell strings CS11 to CS1m and CS21 to CS2m according to an embodiment of the invention is shown.

In both FIGS. 3 and 10, a shadow program operation with respect to source select transistors SST1 of first source select lines SSL1_1 and SSL2_1 in a first row and a second row is performed in S210.

A program voltage, which is a high voltage, is applied to each of first source select lines SSL1_1 and SSL2_1. According to a program voltage applied to each of the first source select lines SSL1_1 and SSL2_1, corresponding source select transistors SST1 are turned on. In addition, a voltage of a common source line CSL may be transmitted to channels. The threshold voltages of the source select transistors SST1 electrically coupled to the first source select lines SSL1_1 and SSL2_1 may be increased by the difference between the voltage and the program voltage of the common source line CSL.

The source select transistors SST1 electrically coupled to the first source select lines SSL1_1 and SSL2_1 are directly electrically coupled to the common source line CSL. When the program voltage is applied to each of the first source select lines SSL1_1 and SSL2_1, the channels of the corresponding source select transistors SST1 may receive the voltage of the common source line CSL regardless of voltages applied to bit lines BL1 to BLm. Therefore, during the shadow program operation through the first source select lines SSL1_1 and SSL2_1, the threshold voltages of the source select transistors SST1 electrically coupled to the first source select lines SSL1_1 and SSL2_1 may not be controlled as a bit line unit. A program voltage may be applied to a gate of the source select transistors SST1 and the threshold voltage of the first source select transistors SST1 may be increased.

During the shadow program operation, a predetermined number of program voltages are applied to each of the first source select lines SSL1_1 and SSL2_1. Accordingly, the peripheral circuit 120 is configured to perform the shadow program operation on the source select transistors SST1 before programming.

When the shadow program operation is completed, the threshold voltage of the source select transistors SST1 electrically coupled to the first source select lines SSL1_1 and SSL2_1 may be increased.

In S220, after the shadow program is completed, a program operation for the source select transistors SST2 and SST3 electrically coupled to the second source select line SSL1_2 in a first row is performed. The program operation with respect to the source select transistors SST2 and SST3 electrically coupled to the second source select line SSL1_2 is the same as described with reference to FIGS. 5 to 8 described above. Duplicate descriptions will be omitted accordingly.

According to the shadow program operation of S210, the threshold voltages of the source select transistors SST1 of the first source select line SSL1_1 are increased. Therefore, during the programming of source select transistors SST2 and SST3 electrically coupled to the second source select line SSL1_2, the source select transistors SST1 electrically coupled to the first source select line SSL1_1 may be stably turned off. As a result, a leakage current through the source select transistors SST1 electrically coupled to the first source select line SSL1_1 may be decreased.

In S230, a program operation with respect to the source select transistors SST2 and SST3 electrically coupled to the second source select line SSL2_2 in a second row is performed. The program operation with respect to the source select transistors SST2 and SST3 of the second source select line SSL2_2 is performed the same as described with reference to FIGS. 5 to 8 described above.

The program operation with respect to the second source select line SSL1_2 in the first row and the program operation with respect to the second source select line SSL2_2 in the second row are controlled as a bit line unit. Accordingly, the threshold voltages of the source select transistors SST2 and SST3 may have a voltage distribution less than the source select transistors SST1.

In an embodiment, after completing the program operation for each of the second source select lines SSL1_2 and SSL2_2, an erase operation for the source select transistors SST1 of the first source select lines SSL1_1 and SSL2_1 may be additionally performed. According to the erase operation, the threshold voltages of the source select transistors SST1 of the first source select lines SSL1_1 and SSL2_1 may be less than a reference voltage. Accordingly, during a program operation and a read operation for memory cells MC1 to MCn, the source select transistors SST1 of the first source select lines SSL1_1 and SSL2_1 may efficiently flow a current. In the above-described embodiment, in the program operation and the read operation for the memory cells MC1 to MCn, the cell strings CS11 to CS1m in the first row, which are electrically coupled to or decoupled from the common source line CSL, may be performed by controlling the second source select line SSL1_2. During the program operation and the read operation with respect to the memory cells MC1 to MCn, the cell strings CS21 to CS2m in the second row, electrically coupled to or decoupled from the common source line CSL, may be performed by controlling the second source select line SSL2_2.

Referring to FIG. 11, a table illustrating voltages applied in S210 of FIG. 10 according to an embodiment of the invention is shown.

In both FIGS. 3 and 11, during a shadow program operation, a reference voltage (Vss, e.g., a ground voltage) is applied to the bit lines BL1 to BLm. The reference voltage is also applied to the drain select lines DSL1 and DSL2, the word lines WL1 to WLn, the second source select lines SSL1_2 and SSL2_2 and the common source line CSL. The reference voltage Vss may also be applied to at least one of the memory cells (MC1 to MCn) and the source select transistors SST2 and SST3. The threshold voltages of the drain select transistors DST1 to DST3, the memory cells MC1 to MCn, and the source select transistors SST2 and SST3 may be maintained.

The program voltage Vpgm, which is a high voltage, is applied to the first source select lines SSL1_1 and SSL2_1. The threshold voltages of the source select transistors SST1 electrically coupled to the first source select lines SSL1_1 and SSL2_1 may be increased.

Referring to FIG. 12, a table illustrating voltages applied in S210 of FIG. 10 according to an embodiment of the invention is shown.

In both FIGS. 3 and 12, during a shadow program operation, the bit lines BL1 to BLm, the drain select lines DSL1 and DSL2, the word lines WL1 to WLn, and the second source select lines SSL1_2 and SSL2_2 are floating. The bit lines BL1 to BLm, the drain select lines DSL1 and DSL2, the word lines WL1 to WLn, and the second source select lines SSL1_2 and SSL2_2 have increased voltages according to the program voltage Vpgm of the first source select lines SSL1_1 and SSL2_1. Therefore, electrical fields between the increased voltages and the first source select lines SSL1_1 and SSL2_1 may be decreased.

The program voltage Vpgm, which is a high voltage, is applied to the first source select lines SSL1_1 and SSL2_1. The reference voltage Vss is applied to the common source line CSL. The threshold voltages of the source select transistors SST1 electrically coupled to the first source select lines SSL1_1 and SSL2_1 may be increased accordingly.

Referring to FIG. 13, a table illustrating voltages applied in S210 of FIG. 10 according to an embodiment of the invention is shown.

Referring back to FIGS. 3 and 12, during a shadow program operation, the reference voltage Vss is applied to the bit lines BL1 to BLm. First and second pass voltages Vpass1 and Vpass2 are applied to the drain select lines DSL1 and DSL2, the word lines WL1 to WLn, and the second source select lines SSL1_2 and SSL2_2. The first and second pass voltages Vpass1 and Vpass2 may be a voltage to turn on the drain select transistors DST1 to DST3, the memory cells MC1 to MCn, and the source select transistors SST2 and SST3. The second pass voltage Vpass2 may be less than the first pass voltage Vpass1. Accordingly, the reference voltage Vss of the bit lines BL1 to BLm is transmitted to channels of the first source select transistors SST1 electrically coupled to the first source select lines SSL1_1 and SSL2_1.

When the above-described case is applied to the memory block BLK1' described with reference to FIG. 4, the voltages Vpass1 and Vpass2 applied to the drain select lines DSL1 and DSL2, the word lines WL1 to WLn, and the second source select lines SSL1_2 and SSL2_2 are increased as a corresponding line is closer to the first source select lines SSL1_1 and SSL2_1. As a result, electrical fields between the first source select lines SSL1_1 and SSL2_1 and the drain select lines DSL1 and DSL2, the word lines WL1 to WLn, and the second source select lines SSL1_2 and SSL2_2 may be decreased accordingly.

The program voltage Vpgm, which is a high voltage, is applied to the first source select lines SSL1_1 and SSL2_1. The reference voltage Vss is applied to the common source line CSL. The channels of the source select transistors SST1 electrically coupled to the first source select lines SSL1_1 and SSL2_1 may receive the reference voltage Vss from the bit lines BL1 to BLm and common source line CSL. The threshold voltages of the source select transistors SST1 electrically coupled to the first source select lines SSL1_1 and SSL2_1 may be increased by a difference between the program voltage Vpgm and the reference voltage Vss.

Figure 14:
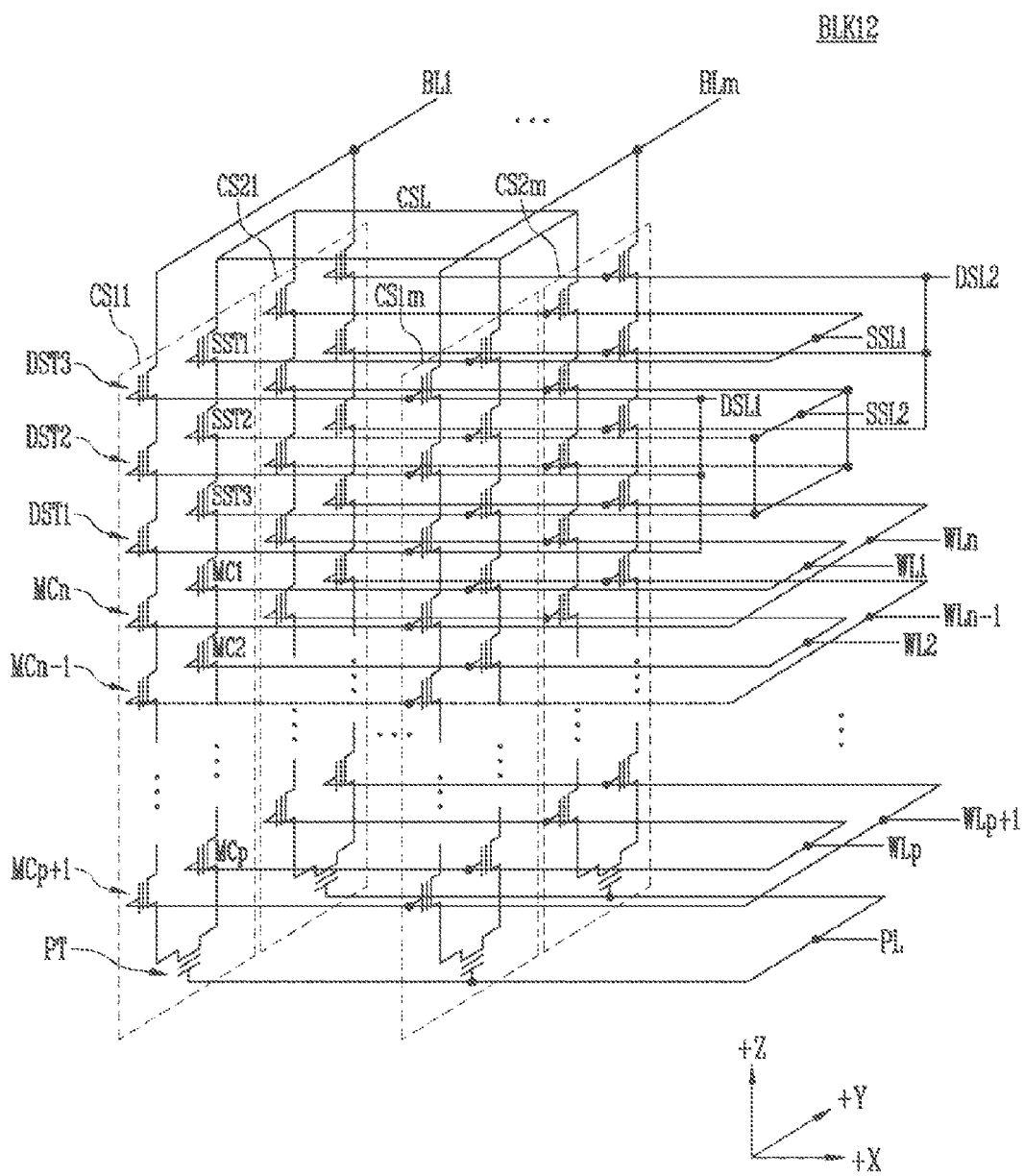
FIG. 14 is a circuit diagram illustrating an modified memory block of FIG. 3 according to an embodiment of the invention.

Referring to FIG. 14, a circuit diagram illustrating a modified memory block BLK12 of the memory block BLK1 of FIG. 3 according to an embodiment of the invention is shown.

In FIG. 14, when excluding first to third source select transistors SST1 to SST3 and source select lines SSL1_1, SSL1_2, SSL2_1, and SSL2_2, a memory block BLK11 is operated the same as the memory block BLK1 of FIG. 3. Therefore, duplicated descriptions will be omitted.

According to an embodiment, first source select transistors SST1 included in cell strings CS11 to CS1m in a first row and first source select transistors SST1 included in cell strings CS21 to CS2m in a second row are electrically coupled to one first source select line SSL1. Second and third source select transistors SST2 and SST3 included in the cell strings CS11 to CS1m in the first row and second and third source select transistors SST2 and SST3 included in the cell strings CS21 to CS2m in the second row are electrically coupled to a second source select line SSL2.

Referring to FIG. 15, a table illustrating voltages applied in S110 when applying the embodiment shown in FIG. 6 to a memory block BLK12 of FIG. 14 is shown.

In both FIGS. 14 and 15, a program permission voltage Vpmt is applied to a program permission bit line Vpmt among bit lines BL1 to BLm. A program inhibition voltage Vprh is applied to a program inhibition bit line Vprh among the bit lines BL1 to Blm. A drain select line voltage Vdsl greater than the program permission voltage Vpmt and less than or equal to the program inhibition voltage Vprh is applied to a drain select line DSL1 electrically coupled to selected cell strings CS11 to CS1m. Drain select transistors DST1 to DST3 of a program permission cell string may be turned on. Drain select transistors DST1 to DST3 of a program inhibition cell string may be turned off. A word line voltage Vwl is applied to word lines WL1 to WLn. Accordingly, the second and third source select transistors SST2 and SST3 of the program permission cell string receive the program permission voltage Vpmt from a program permission bit line BLpmt through the drain select transistors DST1 to DST3 and memory cells MC1 to MCn. The program inhibition cell string is electrically decoupled from a program inhibition bit line BLprh.

A turn off voltage Vtrf is applied to a first source select line SSL1 adjacent to the common source line CSL. A common source line voltage Vcsl is applied to the common source line CSL. Therefore, the program permission cell string and the program inhibition cell string are electrically decoupled from the common source line CSL.

A program voltage Vpgm is applied to a second source select line SSL2. Threshold voltages of the second and third source select transistors SST2 and SST3 of the program permission cell string among the selected cell strings CS11 to CS1m may be increased. Threshold voltages of second and third source select transistors SST2 and SST3 of the program inhibition cell string may not be increased.

A reference voltage Vss is applied to a second drain select line DSL2 electrically coupled to unselected cell strings CS21 to CS2m. The reference voltage Vss is a voltage to turn off drain select transistors DST1 to DST3 electrically coupled to the second drain select line DSL2. A reference voltage applied to the second drain select line DSL2 is less than the program inhibition voltage Vprh. The same reference voltage is also less than or equal to the program permission voltage Vpmt. Therefore, the drain select transistors DST1 to DST3 electrically coupled to the second drain select line DSL2 may be turned off. The unselected cell strings CS21 to CS2m are electrically decoupled from the bit lines BL1 to BLm.

The first source select line SSL1 is electrically coupled not only to the selected cell strings CS11 to CS1m, but also to source select transistors SST1 of the unselected cell strings CS21 to CS2m. The unselected cell strings CS21 to CS2m, which are to the same as the selected cell strings CS11 to CS1m, are electrically decoupled from the common source line CSL by the turn off voltage Vtrf applied to the first source select line SSL1.

Therefore, channels of the unselected cell strings CS21 to CS2m are floating. The channels of the unselected cell strings CS21 to CS2m are boosted together with the program voltage Vpgm of the second source select line SSL2. Moreover, threshold voltages of the second and third source select transistors SST2 and SST3 of the unselected cell strings CS21 to CS2m are not increased since a difference between a boosted voltage of a channel and the program voltage Vpgm of the second source select line SSL2 is small. In addition, the memory cells MC1 to MCn, at least one drain select transistors DST1 to DST3, and the source select transistor SST2 may be floating.

Therefore, even though the cell strings CS11 to CS1m in the first row and the cell strings CS21 to CS2m in the second row share one second source select line SSL2, the source select transistors SST2 and SST3 of the selected cell strings CS11 to CS1m may be programmed. In addition, the source select transistors SST2 and SST3 of the unselected cell strings CS21 to CS2m may be inhibited for programming.

Figure 16:
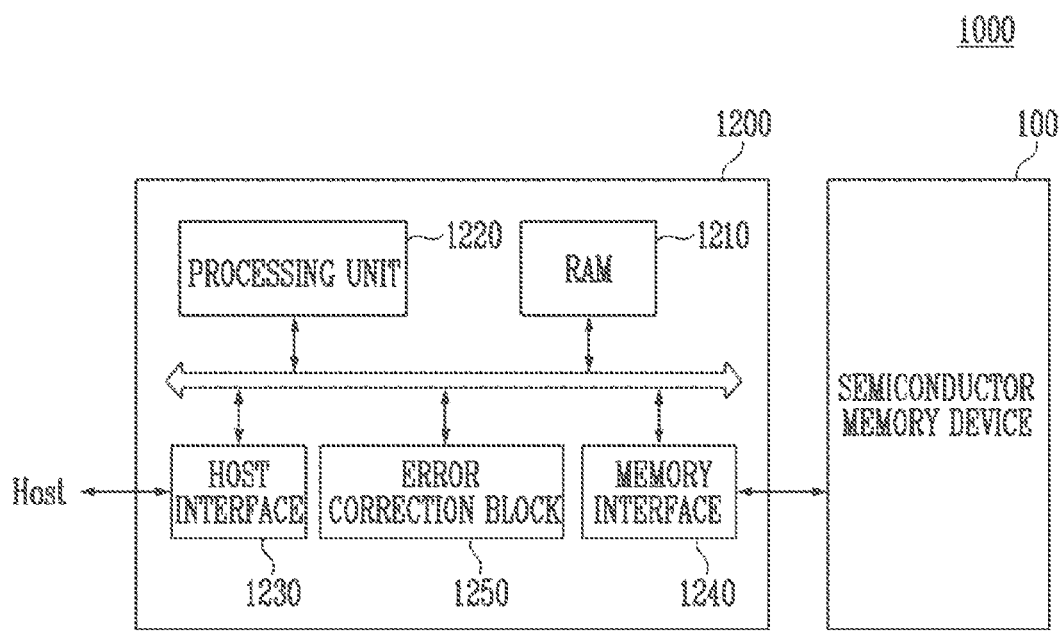
FIG. 16 is a block diagram illustrating a memory system including the semiconductor memory device of FIG. 1.

Referring to FIG. 16, a block diagram illustrating a memory system 1000 including the semiconductor memory device 100 of FIG. 1 is shown.

The memory system 1000 includes the semiconductor memory device 100 and a controller 1200.

The semiconductor memory device 100 may be formed and operated as described with reference to FIG. 1. Duplicate descriptions will be omitted accordingly.

A controller 1200 is electrically coupled to a host Host and the semiconductor memory device 100. In response to a request from the host Host, the controller 1200 is configured to access the semiconductor memory device 100. For example, the controller 1200 is configured to control a read operation, a write operation, an erase operation. The controller 1200 is also configured to control a background operation of the semiconductor memory device 100. The controller 1200 is configured to provide an interface between the semiconductor memory device 100 and the host Host. The controller 1200 is configured to drive a firmware to control the semiconductor memory device 100.

The controller 1200 includes a random access memory (RAM) 1210, a processing unit 1220, a host interface 1230, a memory interface 1240, and an error correction block 1250.

The RAM 1210 is used as at least once among an operation memory of the processing unit 1220, a cache memory between the semiconductor memory device 100 and the host Host, and a buffer memory between the semiconductor memory device 100 and the host Host.

The processing unit 1220 is configured to control overall operations of the controller 1200.

The host interface 1230 includes a protocol to perform data exchange between the host Host and the controller 1200. In an embodiment, the controller 1200 is configured to communicate with the host Host through at least one of various interface protocols such as a Universal Serial Bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and/or the like.

The memory interface 1240 is configured to interface with the semiconductor memory device 100. For example, the memory interface 1240 includes a NAND interface or a NOR interface.

The error correction block 1250 is configured to detect and correct an error in data received from the semiconductor memory device 100 by using an error correcting code (ECC).

Since the semiconductor memory device 100 described with reference to FIGS. 1 to 15 is provided, the memory system 1000 having improved reliability is provided accordingly.

The controller 1200 and the semiconductor memory device 100 may be integrated into one semiconductor device. In an embodiment, the controller 1200 and the semiconductor memory device 100 may form a memory card after being integrated into one semiconductor device. For example, the controller 1200 and the semiconductor memory device 100 are integrated into one semiconductor device and form a memory card such as a PC card (e.g., a personal computer memory card international association (PCMCIA)), a compact flash (CF) card, a smart media (SM) card (SMC), a memory stick, a multimedia card (MMC, e.g., RS-MMC and MMCmicro), an SD card (e.g., SD, miniSD, microSD, and SDHC), a universal flash (UFS) memory device, or the like.

The controller 1200 and the semiconductor memory device 100 are integrated into one semiconductor device and form a semiconductor solid state drive (SSD). The semiconductor SSD includes a storage device configured to store data in a semiconductor memory. When the memory system 1000 is used as the semiconductor SSD, an operation speed of the host Host electrically coupled to the memory system 1000 is dramatically improved as a result.

In an embodiment, the memory system 1000 is provided as one of various components of electronic device such as a computer, an ultra-mobile PC (UMPC), a workstation, a netbook, a personal digital assistants (PDAs), a portable computer, a web tablet, a wireless phone, a mobile phone, a smart phone, an e-book, a portable multimedia player (PMP), a portable game console, a navigation device, a black box, a digital camera, a three-dimensional television, a digital audio recorder, a digital audio player, a digital picture recorder, a digital picture player, a digital video recorder, a digital video player, a device capable of transmitting/receiving information in wireless environment, one of various electronic devices configuring a home network, one of various electronic devices configuring a computer network, one of various electronic devices configuring a telematics network, an RFID device, one of various components configuring a computing system, or the like.

In an embodiment, the semiconductor memory device 100 or the memory system 1000 may be mounted with various types of packages. For example, the semiconductor memory device 100 or the memory system 1000 may be mounted with a package type such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multichip package (MCP), a wafer-level fabricated package (WFP), a wafer-level processed stack package (WSP), or the like.

Figure 17:
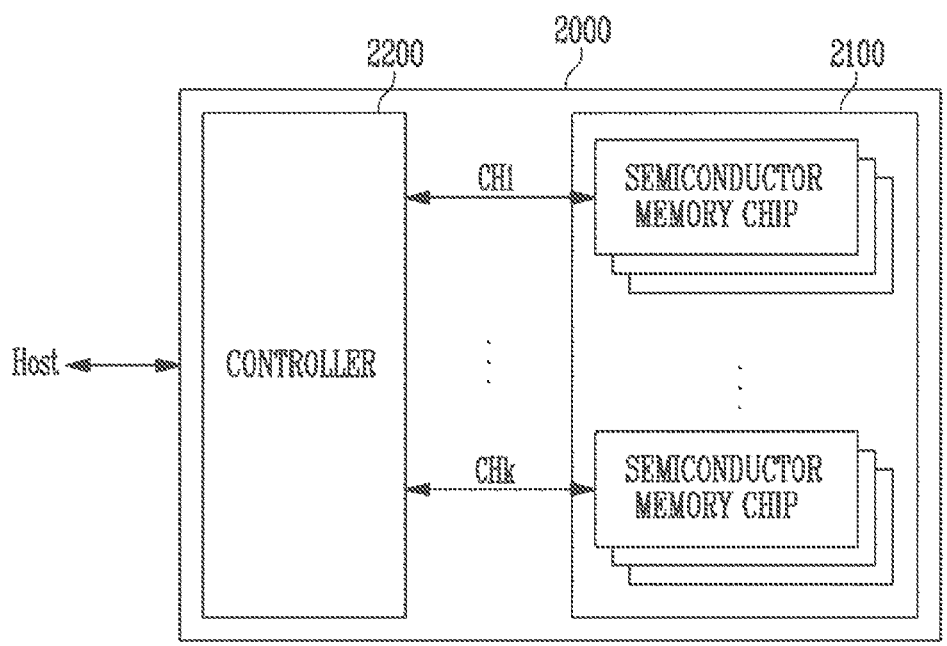
FIG. 17 is a block diagram illustrating an application embodiment of the memory system of FIG. 16.

Referring to FIG. 17, a block diagram illustrating an application embodiment 2000 of the memory system 1000 of FIG. 16 is shown.

A memory system 2000 includes a semiconductor memory device 2100 and a controller 2200. The semiconductor memory device 2100 includes a plurality of semiconductor memory chips. The plurality of semiconductor memory chips are divided into a plurality of groups.

The plurality of groups each are in communication with the controller 2200 through first to $k^{th}$ channels CH1 to CHk. Each semiconductor memory chip may be formed and operated as the semiconductor memory device 100 described with reference to FIG. 1 described above.

Each group is configured to communicate with the controller 2200 through one common channel. The controller 2200 is configured as the controller 1200 described with reference to FIG. 16. The controller 2200 is configured to control a plurality of memory chips of the semiconductor memory device 2100 through a plurality of channels CH1 to CHk.

A plurality of the semiconductor memory chips electrically coupled to one channel is described. However, the memory system 2000 can be modified to electrically couple one semiconductor memory chip to one channel.

Figure 18:
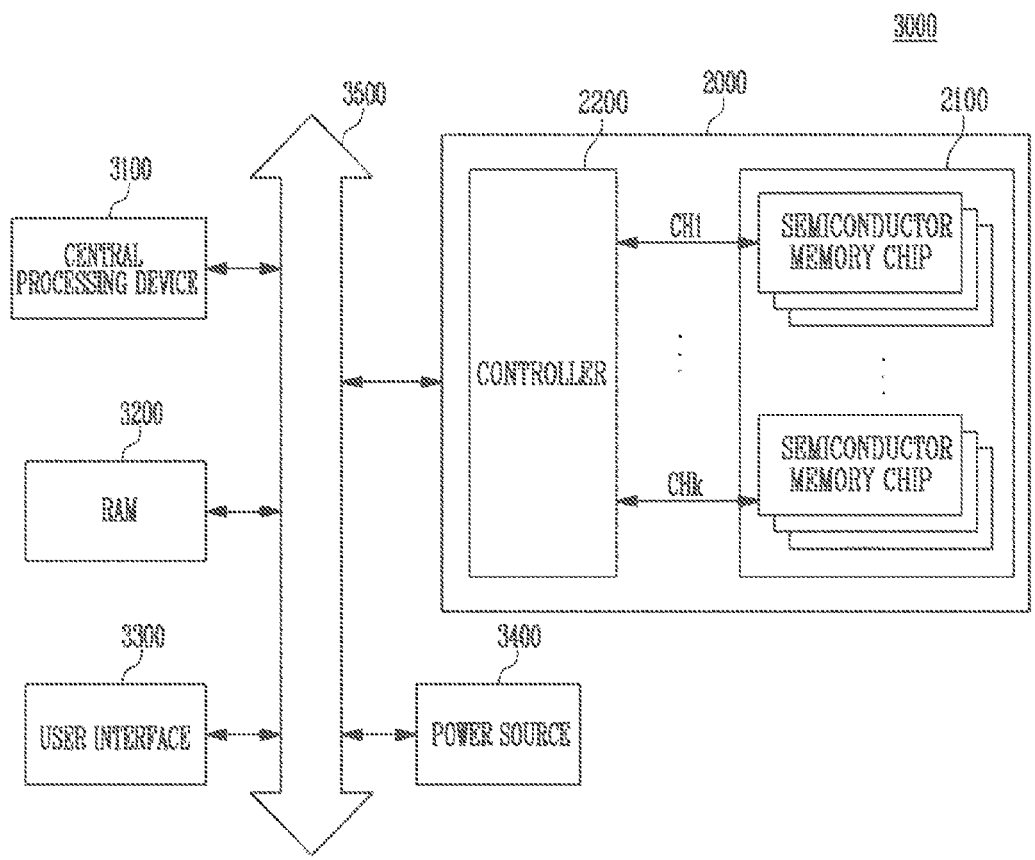
FIG. 18 is a block diagram illustrating a computing system including the memory system described with reference to FIG. 17.

Referring to FIG. 18, a block diagram illustrating a computing system 3000 including the memory system 2000 described with reference to FIG. 17 is described.

The computing system 3000 includes a central processing device 3100, a RAM 3200, a user interface 3300, a power source 3400, a system bus 3500, and a memory system 2000.

The memory system 2000 is electrically coupled to the central processing device 3100, the RAM 3200, the user interface 3300, and the power 3400 through the system bus 3500. Data provided through user interface 3300 or processed by the central processing device 3100 is stored in the memory system 2000.

The semiconductor memory device 2100 is electrically coupled to the system bus 3500 through the controller 2200. However, the semiconductor memory device 2100 may be configured to be electrically coupled directly to the system bus 3500. In this instance, function of the controller 2200 may be performed by the central processing device 3100 and the RAM 3200.

The memory system 2000 described with reference to FIG. 17 is provided. However, the memory system 2000 may be replaced by the memory system 1000 described with reference to FIG. 16. In an embodiment, the computing system 3000 may be formed to include all of the memory systems 1000 and 2000 described with reference to FIGS. 16 and 17.

According to an embodiment of the invention, at least one first source select transistor adjacent to the common source line of each cell string is electrically coupled to the first source select line. In addition, a rest of the source select transistors are electrically coupled to another source select line. Further, the program operation for the rest of the source select transistors may be efficiently performed by controlling the first source select line. Therefore, the semiconductor memory device having improved reliability is provided as a result.

According to the invention, a semiconductor memory device having improved reliability and an operating method are provided.

In the figures and specification, there have been disclosed embodiments of the invention, and although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made without departing from the spirit and scope of the invention as defined by the following claims.

What is claimed is:

1. An operating method of a semiconductor memory device which comprises cell strings comprising a plurality of source select transistors electrically coupled to a common source line in series, at least one drain select transistor electrically coupled to a bit line, and memory cells electrically coupled between the at least one drain select transistor and the source select transistors, wherein the operating method comprises:
programming a second source select transistor electrically coupled to the common source line through a first source select transistor;
reprogramming the second source select transistor when a threshold voltage of the second source select transistor is less than a target voltage; and
ending a program with respect to the second source select transistor when the threshold voltage of the second source select transistor is greater than or equal to the target voltage,
wherein the programming comprises:
applying a program permission voltage to the bit line;
turning on the at least one drain select transistor and the memory cells and transmitting the program permission voltage to the second source select transistor;
turning off the first source select transistor and electrically decoupling the second source select transistor from the common source line; and
applying a program voltage to the second source select transistor and increasing the threshold voltage of the second source select transistor.

2. The operating method of claim 1, further comprising:
shadow-programming the first source select transistor before the programming such that a threshold voltage of the first source select transistor is increased.

3. The operating method of claim 2, wherein the shadow-programming comprises:
applying a reference voltage to the at least one drain select transistor, the memory cells, and the second source select transistor; and
applying a second program voltage to a gate of the first source select transistor to increase a threshold voltage of the first source select transistor.

4. The operating method of claim 2, wherein the shadow-programming comprises:
floating the at least one drain select transistor, the memory cells, and the second source select transistor; and
applying a second program voltage to a gate of the first source select transistor to increase a threshold voltage of the first source select transistor.

5. The operating method of claim 2, wherein the shadow-programming comprises:
turning on the at least one drain select transistor, the memory cells, and the second source select transistor; and
applying a second program voltage to a gate of the first source select transistor to increase a threshold voltage of the first source select transistor.

6. The operating method of claim 2, further comprising:
performing an erase operation on the first source select transistor after the programming of the second source select transistor.

7. The operating method of claim 1, wherein the first source select transistor is electrically coupled to a first source select line, the second source select transistor is electrically coupled to a second source select line, the memory cells are electrically coupled to respective word lines, and the at least one drain select transistor is electrically coupled to a drain select line.

8. The operating method of claim 7, wherein, in the electrical decoupling of the second source select transistor from the common source line, a common source line voltage having a positive voltage is applied to the common source line, and a turn off voltage smaller than or equal to the common source line voltage is applied to the first source select line and the first source select transistor is turned off.

9. The operating method of claim 8, wherein the turn off voltage is a reference voltage, and a threshold voltage of the first source select transistor is a positive voltage.

10. The operating method of claim 7, wherein the transmitting of the program permission voltage to the second source select transistor comprises:
applying a drain select line voltage greater than the program permission voltage to the drain select line and turning on the at least one drain select transistor; and
applying a word line voltage to the word lines and turning on the memory cells.

11. The operating method of claim 10, wherein the memory cells are in an erase state, and the word line voltage is either a ground voltage or a positive voltage.

12. The operating method of claim 10, wherein, in the ending of the program, a program inhibition voltage is applied to the bit line, and the program inhibition voltage is greater than or equal to the drain select line voltage.

13. The operating method of claim 1, wherein the reprogramming comprises:
applying the program permission voltage to the bit line;
turning on the at least one drain select transistor and the memory cells and transmitting the program permission voltage to the second source select transistor;
turning off the first source select transistor and electrically decoupling the second source select transistor from the common source line; and
applying a voltage greater than the program voltage to a gate of the second source select transistor and increasing the threshold voltage of the second source select transistor.

14. An operating method of a semiconductor memory device which comprises cell strings each comprising at least one first source select transistor electrically coupled to a common source line, at least one second source select transistor electrically coupled to the common source line through the first source select transistor, at least one drain select transistor electrically coupled to a bit line, and memory cells electrically coupled between the at least one drain select transistor and the second source select transistor, wherein the operating method comprises:
applying a program permission voltage or a program inhibition voltage to bit lines of the cell strings;
applying a drain select line voltage greater than the program permission voltage and less than or equal to the program inhibition voltage to a drain select line electrically coupled to drain select transistors of the cell strings and turning on or turning off the drain select transistors;
applying a word line voltage to memory cells of the cell strings;
turning off first source select transistors of the cell strings; and
applying a program voltage to gates of second source select transistors of the cell strings.

15. The operation method of claim 14,
wherein the first source select transistors undergo a shadow program operation before the second source select transistors are programmed.

16. The operating method of claim 14, wherein, a common source line voltage having a positive voltage is applied to the common source line, and a turn off voltage less than or equal to the common source line voltage is applied to a first source select line electrically coupled to the first source select transistors and the first source select transistor is turned off.

17. The operating method of claim 16, wherein the turn off voltage is a reference voltage, and a threshold voltage of the first source select transistor is greater than 0.

18. A semiconductor memory device, comprising:
a cell string including a plurality of source select transistors electrically coupled to a common source line in series, at least one drain select transistor electrically coupled to a bit line, and memory cells electrically coupled between the at least one drain select transistor and the source select transistors; and
a peripheral circuit configured to control the cell string,
wherein the peripheral circuit is configured to program a second source select transistor electrically coupled to the common source line through a first source select transistor, the peripheral circuit being configured to reprogram the second source select transistor when a threshold voltage of the second source select transistor is less than a target voltage and configured to end a program with respect to the second source select transistor when the threshold voltage of the second source select transistor is greater than or equal to the target voltage, and
the peripheral circuit applies a program permission voltage to the bit line during the programming, turns on the at least one drain select transistor and the memory cells and transmits the program permission voltage to the second source select transistor, turns off the first source select transistor and electrically decouples the second source select transistor from the common source line, and applies a program voltage to a gate of the second source select transistor and increases the threshold voltage of the second source select transistor.

19. The semiconductor memory device of claim 18, wherein the peripheral circuit is configured to perform a shadow program operation on the first source select transistor before the programming.

20. The semiconductor memory device of claim 18, wherein the peripheral circuit applies a common source line voltage having a positive voltage to the common source line, applies a turn off voltage less than or equal to the common source line voltage to a gate of the first source select transistor, and turns off the first source select transistor.

* * * * *